United States Patent
Hamaguchi et al.

(10) Patent No.: US 11,404,849 B2
(45) Date of Patent: *Aug. 2, 2022

(54) LIGHT EMITTING ELEMENT TO CONTROL AN OSCILLATION WAVELENGTH

(71) Applicant: SONY CORPORATION, Tokyo (JP)

(72) Inventors: Tatsushi Hamaguchi, Kanagawa (JP); Shoichiro Izumi, Kanagawa (JP); Susumu Sato, Kanagawa (JP); Noriyuki Futagawa, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/031,232

(22) Filed: Sep. 24, 2020

(65) Prior Publication Data

US 2021/0006040 A1  Jan. 7, 2021

Related U.S. Application Data

(63) Continuation of application No. 16/323,134, filed as application No. PCT/JP2017/021821 on Jun. 13, 2017, now Pat. No. 10,826,275.

(30) Foreign Application Priority Data

Aug. 24, 2016  (JP) .................................. 2016-163337

(51) Int. Cl.
  *H01S 5/183* (2006.01)
  *H01S 5/20* (2006.01)
  (Continued)

(52) U.S. Cl.
  CPC ...... *H01S 5/18369* (2013.01); *H01S 5/04253* (2019.08); *H01S 5/187* (2013.01);
  (Continued)

(58) Field of Classification Search
  CPC ............. H01S 5/18369; H01S 5/05253; H01S 5/18341; H01S 5/187; H01S 5/34333;
  (Continued)

(56) References Cited

U.S. PATENT DOCUMENTS

| 10,826,275 B2 * | 11/2020 | Hamaguchi ......... H01S 5/18369 |
| 2014/0023102 A1 * | 1/2014 | Holder .................. H01S 5/1039 372/44.01 |
| 2014/0023380 A1 * | 1/2014 | Takeda ................. H04B 10/503 398/200 |

FOREIGN PATENT DOCUMENTS

| JP | 2014-022672 A | 2/2014 |
| JP | 2015-035541 A | 2/2015 |
| WO | 2015/194243 A1 | 12/2015 |

OTHER PUBLICATIONS

Non-Final Office Action for U.S. Appl. No. 16/323,134, dated Mar. 18, 2020, 10 pages.

(Continued)

*Primary Examiner* — Quoc D Hoang
(74) *Attorney, Agent, or Firm* — Chip Law Group

(57) ABSTRACT

A light emitting element includes a laminated structure formed by laminating a first light reflecting layer 41, a light emitting structure 20, and a second light reflecting layer 42. The light emitting structure 20 is formed by laminating, from the first light reflecting layer side, a first compound semiconductor layer 21, an active layer 23, and a second compound semiconductor layer 22. In the laminated structure 20, at least two light absorbing material layers 51 are formed in parallel to a virtual plane occupied by the active layer 23.

11 Claims, 6 Drawing Sheets

(51) Int. Cl.
  *H01S 5/042* (2006.01)
  *H01S 5/187* (2006.01)
  *H01S 5/343* (2006.01)
  *H01S 5/10* (2021.01)
  *H01S 5/02* (2006.01)

(52) U.S. Cl.
  CPC ........ *H01S 5/18341* (2013.01); *H01S 5/2022* (2013.01); *H01S 5/34333* (2013.01); *H01S 5/0216* (2013.01); *H01S 5/0217* (2013.01); *H01S 5/04252* (2019.08); *H01S 5/1039* (2013.01); *H01S 5/18377* (2013.01)

(58) Field of Classification Search
  CPC ............. H01S 5/04252; H01S 5/18377; H01S 5/0216; H01S 5/0217
  USPC .......................................................... 257/79
  See application file for complete search history.

(56) References Cited

OTHER PUBLICATIONS

Notice of Allowance for U.S. Appl. No. 16/323,134, dated Jun. 26, 2020, 05 pages.
International Search Report and Written Opinion of PCT Application No. PCT/JP2017/021821, dated Jul. 18, 2017, 05 pages of English Translation and 05 pages of ISRWO.
International Preliminary Report on Patentability of PCT Application No. PCT/JP2017/021821, dated Mar. 7, 2019, 06 pages of English Translation and 03 pages of IPRP.
Office Action for JP Patent Application No. 2018-535479, dated Feb. 24, 2021, 6 pages of Office Action and 6 pages of English Translation.

\* cited by examiner

LIGHT EMITTING ELEMENT TO CONTROL AN OSCILLATION WAVELENGTH

CROSS REFERENCE TO RELATED APPLICATIONS

This application is continuation of U.S. Ser. No. 16/323,134 filed Feb. 4, 2019, which is a U.S. National Phase of International Patent Application No. PCT/JP2017/021821 filed Jun. 13, 2017, which claims priority benefit of Japanese Patent Application No. JP 2016-163337 filed in the Japan Patent Office on Aug. 24, 2016. Each of the above-referenced applications is hereby incorporated herein by reference in its entirety.

TECHNICAL FIELD

The present disclosure relates to a light emitting element (specifically, a surface emitting laser element also referred to as a vertical cavity laser (VCSEL)).

BACKGROUND ART

For example, as disclosed in Japanese Patent Application Laid-Open No. 2015-035541, in the surface emitting laser element, laser oscillation occurs by resonating light between two light reflecting layers (distributed Bragg reflector layers (DBR layers)). A light emitting structure is formed between the two DBR layers. When an equivalent refractive index of a whole laminated structure constituted by the two DBR layers and the light emitting structure formed therebetween is represented by $n_{eq}$, and a wavelength of laser light to be emitted from the surface emitting laser element is represented by $\lambda_0$, a length L of a resonator in the laminated structure is expressed by $$L=(m \cdot \lambda_0)/(2 \cdot n_{eq}).$$

Here, m represents a positive integer. The equivalent refractive index $n_{eq}$ will be described later.

By the way, in the surface emitting laser element, a wavelength at which oscillation is possible is determined by the length L of a resonator. Each oscillation mode that can oscillate is referred to as a longitudinal mode. In addition, among the longitudinal modes, a longitudinal mode that matches with a gain spectrum determined by an active layer can cause laser oscillation. When an effective refractive index is represented by $n_{eff}$, an interval $\Delta\lambda$ between longitudinal modes is expressed by $$\lambda_0^2/(2 n_{eff} \cdot L).$$

In other words, the longer the length L of a resonator is, the narrower the interval $\Delta\lambda$ between longitudinal modes is. Therefore, in a case where the length L of a resonator is long, a plurality of longitudinal modes can exist in a gain spectrum, and therefore a plurality of longitudinal modes can oscillate. Note that the following relationship is satisfied between the equivalent refractive index $n_{eq}$ and the effective refractive index $n_{eff}$ when an oscillation wavelength is represented by $\lambda$.

$$n_{eff} = n_{eq} - \lambda \cdot (dn_{eq}/d\lambda)$$

Here, in a case where the length L of a resonator is as short as 1 µm or less, one kind (one wavelength) of laser light in a longitudinal mode is usually emitted from a surface emitting laser element (see the conceptual diagram of FIG. 6A). Therefore, it is possible to accurately control an oscillation wavelength of the laser light emitted from the surface emitting laser element.

CITATION LIST

Patent Document

Patent Document 1: Japanese Patent Application Laid-Open No. 2015-035541

SUMMARY OF THE INVENTION

Problems to be Solved by the Invention

Meanwhile, in a case where the length L of a resonator is as long as several times or more the wavelength of laser light emitted from a surface emitting laser element, a plurality of kinds of laser light in longitudinal modes can be emitted from the surface emitting laser element (see the conceptual diagram of FIG. 6B), and it is difficult to accurately control an oscillation wavelength of the laser light emitted from the surface emitting laser element.

Therefore, an object of the present disclosure is to provide a light emitting element having a configuration and a structure that make it possible to accurately control an oscillation wavelength of emitted laser light.

Solutions to Problems

In order to achieve the above object, a light emitting element of the present disclosure includes a laminated structure formed by laminating:
a first light reflecting layer;
a light emitting structure; and
a second light reflecting layer, in which
the light emitting structure is formed by laminating:
from the first light reflecting layer side,
a first compound semiconductor layer;
an active layer (light emitting layer); and
a second compound semiconductor layer, and
in the laminated structure, at least two light absorbing material layers are formed in parallel to a virtual plane occupied by the active layer.

Effects of the Invention

In the light emitting element of the present disclosure, since at least two light absorbing material layers are formed in the laminated structure, among a plurality of kinds of laser light in longitudinal modes that can be emitted from a surface emitting laser element, oscillation of undesired laser light in a longitudinal mode can be suppressed. As a result, it is possible to accurately control an oscillation wavelength of emitted laser light. Note that effects described here are merely illustrative, and are not restrictive. Furthermore, an additional effect may be present.

MODE FOR CARRYING OUT THE INVENTION

Figure 1A:
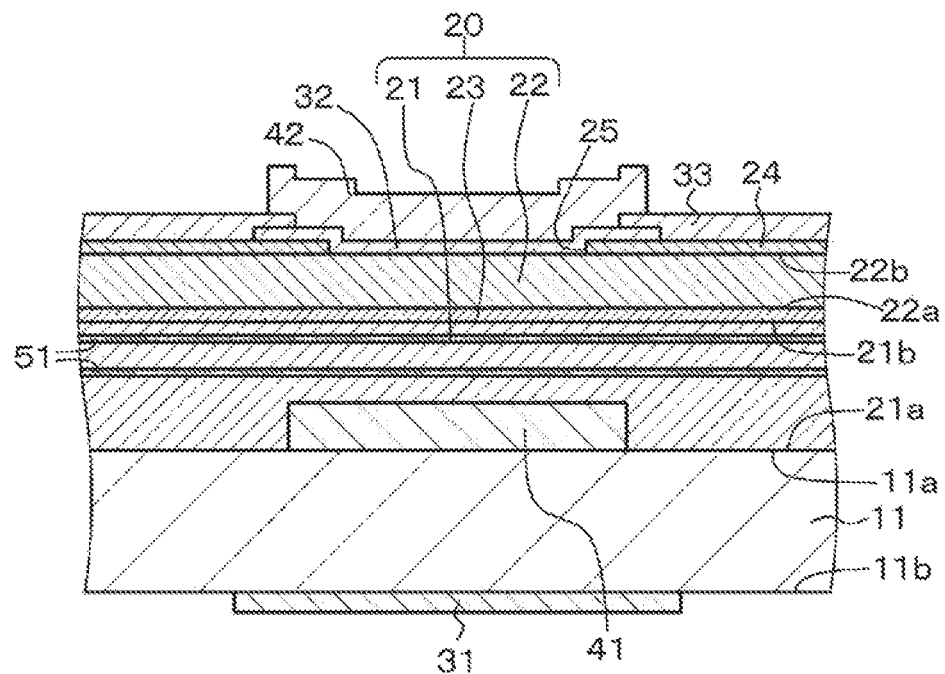
FIGS. 1A and 1B are schematic partial cross-sectional views of a light emitting element of Example 1 and a modification thereof, respectively.

Hereinafter, the present disclosure will be described on the basis of Examples with reference to the drawings. However, the present disclosure is not limited to Examples, and various numerical values and materials in Examples are illustrative. Note that description will be made in the following order.

1. General description of light emitting element of the present disclosure
2. Example 1 (light emitting element of the present disclosure)
3. Example 2 (modification of Example 1)
4. Example 3 (another modification of Example 1)
5. Example 4 (modification of Examples 1 to 3)
6. Others <General Description of Light Emitting Element of the Present Disclosure>

In the following description, a surface of a first compound semiconductor layer facing an active layer (light emitting layer) may be referred to as a second surface of the first compound semiconductor layer, and a surface of the first compound semiconductor facing the second surface of the first compound semiconductor layer may be referred to as a first surface of the first compound semiconductor layer. Furthermore, a surface of a second compound semiconductor layer facing the active layer may be referred to as a first surface of the second compound semiconductor layer, and a surface of the second compound semiconductor facing the first surface of the second compound semiconductor layer may be referred to as a second surface of the second compound semiconductor layer.

In a light emitting element of the present disclosure, at least four light absorbing material layers are preferably formed.

In the light emitting element of the present disclosure including the above-described preferred embodiment, when an oscillation wavelength (desired oscillation wavelength emitted from the light emitting element) is represented by $\lambda_0$, an equivalent refractive index of the whole of the two light absorbing material layers and a portion of the laminated structure located between the light absorbing material layers is represented by $n_{eq}$, and a distance between the light absorbing material layers is represented by $L_0$, $$0.9 \times \{(m \cdot \lambda_0)/(2 \cdot n_{eq})\} \le L_0 \le 1.1 \times \{(m \cdot \lambda_0)/(2 \cdot n_{eq})\}$$

is preferably satisfied. Here, m is 1 or any integer of 2 or more including 1. When the thickness of each of layers constituting the two light absorbing material layers and a portion of the laminated structure located between the light absorbing material layers is represented by $t_i$, and the refractive index thereof is represented by $n_i$, the equivalent refractive index $n_{eq}$ is represented by $$n_{eq} = \Sigma(t_i \times n_i)/\Sigma(t_i).$$

Provided that i=1, 2, 3 . . . , I, "I" represents the total number of layers constituting the two light absorbing material layers and a portion of the laminated structure located between the light absorbing material layers, and "Σ" means calculating the sum of values from i=1 to i=I. In order to determine the equivalent refractive index $n_{eq}$, it is only required to observe constituent materials by electron microscopic observation or the like of a cross section of the light emitting element and to perform calculation on the basis of a known refractive index of each of the constituent materials and the thickness thereof obtained by observation. In a case where m is 1, in all the plurality of light absorbing material layers, a distance between adjacent light absorbing material layers satisfies $$0.9 \times \{\lambda_0/(2 \cdot n_{eq})\} \le L_0 \le 1.1 \times \{\lambda_0/(2 \cdot n_{eq})\}.$$

In addition, when m is any integer of 2 or more including 1, for example, if m=1 or 2, in some light absorbing material layers, a distance between adjacent light absorbing material layers satisfies $0.9 \times \{\lambda_0/(2 \cdot n_{eq})\} \le L_0 \le 1.1 \times \{\lambda_0/(2 \cdot n_{eq})\}$, and in the remaining light absorbing material layers, a distance between adjacent light absorbing material layers satisfies $0.9 \times \{(2 \cdot \lambda_0)/(2 \cdot n_{eq})\} \le L_0 1.1 \times \{(2 \cdot \lambda_0)/(2 \cdot n_{eq})\}$. Broadly, in some light absorbing material layers, a distance between adjacent light absorbing material layers satisfies, $0.9 \times \{\lambda_0/(2 \cdot n_{eq})\} \le L_0 \le 1.1 \times \{\lambda_0/(2 \cdot n_{eq})\}$, and in the remaining light absorbing material layers, a distance between adjacent light absorbing material layers satisfies $0.9 \times \{(m' \cdot \lambda_0)/(2 \cdot n_{eq})\} \le L_0 \le 1.1 \times \{(m' \cdot \lambda_0)/(2 \cdot n_{eq})\}$. Here, m' is any integer of 2 or more. Furthermore, the distance between adjacent light absorbing material layers is a distance between the centers of gravity of the adjacent light absorbing material layers. In other words, actually, the distance is a distance between the centers of light absorbing material layers when the light absorbing material layers are cut with a virtual plane of the active layer in a thickness direction thereof.

Moreover, in the light emitting element of the present disclosure including the above-described various preferred embodiments, the light absorbing material layers preferably have a thickness of $\lambda_0/(4 \cdot n_{eq})$ or less. A lower limit value of the thickness of the light absorbing material layers may be 1 nm, for example.

Moreover, in the light emitting element of the present disclosure including the above-described various preferred embodiments, the light absorbing material layers may be located at a minimum amplitude portion generated in a standing wave of light formed in the laminated structure.

Moreover, in the light emitting element of the present disclosure including the above-described various preferred embodiments, the active layer may be located at a maximum amplitude portion generated in a standing wave of light formed in the laminated structure.

Moreover, in the light emitting element of the present disclosure including the above-described various preferred embodiments, the light absorbing material layers may have an optical absorption coefficient of twice or more the optical absorption coefficient of a compound semiconductor constituting the light emitting structure. Here, the optical absorption coefficient of the light absorbing material layers and the optical absorption coefficient of a compound semiconductor constituting the light emitting structure can be determined by observing constituent materials by electron microscopic observation or the like of a cross section of the light emitting element and analogizing on the basis of known evaluation results obtained by observing the constituent materials.

Moreover, in the light emitting element of the present disclosure including the above-described various preferred embodiments, each of the light absorbing material layers may include at least one selected from the group consisting of a compound semiconductor material having a narrower band gap than the compound semiconductor constituting the light emitting structure, a compound semiconductor material doped with impurities, a transparent conductive material, and a light reflecting layer constituting material having a light absorbing characteristic. Here, examples of the compound semiconductor material having a narrower band gap than the compound semiconductor constituting the light emitting structure include InGaN in a case where the compound semiconductor constituting the light emitting structure is GaN. Examples of the compound semiconductor material doped with impurities include n-GaN doped with Si and n-GaN doped with B. Examples of the transparent conductive material include a transparent conductive material constituting an electrode described later. Examples of the light reflecting layer constituting material having a light absorbing characteristic include a material constituting a light reflecting layer described later (for example, $SiO_X$, $SiN_X$, $TaO_X$, or the like). Each of the light absorbing material layers may include one of these materials. Alternatively, each of the light absorbing material layers may include various materials selected from these materials. However, one light absorbing material layers preferably includes one material from a viewpoint of simplification of forming the light absorbing material layers. The light absorbing material layers may be formed in the first compound semiconductor layer, in the second compound semiconductor layer, in the first light reflecting layer, or in the second light reflecting layer. Alternatively, any combination thereof may be used. Alternatively, the light absorbing material layers can also serve as an electrode including a transparent conductive material described later.

Moreover, in the light emitting element of the present disclosure including the above-described various preferred embodiments, the first compound semiconductor layer, the active layer, and the second compound semiconductor layer (light emitting laminate) may each include a GaN-based compound semiconductor material. Here, specific examples of the GaN-based compound semiconductor include GaN, AlGaN, InGaN, and AlInGaN. Moreover, these compound semiconductors may contain a boron (B) atom, a thallium (Tl) atom, an arsenic (As) atom, a phosphorus (P) atom, or an antimony (Sb) atom, if desired. The active layer preferably has a quantum well structure. Specifically, the active layer may have a single quantum well structure (SQW structure) or a multiple quantum well structure (MQW structure). The active layer having a quantum well structure has a structure obtained by laminating at least one well layer and at least one barrier layer. Examples of a combination of (a compound semiconductor constituting the well layer, a compound semiconductor constituting the barrier layer) include $(In_yGa_{(1-y)}N, GaN)$, $(In_yGa_{(1-y)}N, In_zGa_{(1-z)}N)$ [provided that y>z is satisfied], and $(In_yGa_{(1-y)}N, AlGaN)$. The first compound semiconductor layer may include a compound semiconductor of a first conductivity type (for example, n-type), and the second compound semiconductor layer may include a compound semiconductor of a second conductivity type (for example, p-type) different from the first conductivity type. The first compound semiconductor layer and the second compound semiconductor layer are also referred to as a first cladding layer and a second cladding layer, respectively. A current confinement structure is preferably formed between a second electrode described later and the second compound semiconductor layer. Each of the first compound semiconductor layer and the second compound semiconductor layer may be a single structure layer, a multilayer structure layer, or a superlattice structure layer. Moreover, each of the first compound semiconductor layer and the second compound semiconductor layer may include a composition gradient layer and a concentration gradient layer.

In order to obtain the current confinement structure, a current confinement layer including an insulating material (for example, $SiO_X$, $SiN_X$, or $AlO_X$) may be formed between the second electrode described later and the second compound semiconductor layer. Alternatively, the second compound semiconductor layer may be etched by a RIE method or the like to form a mesa structure. Alternatively, a part of the laminated second compound semiconductor layer may be partially oxidized from a lateral direction to form a current confinement region. Impurities may be injected into the second compound semiconductor layer by ion implantation to form a region having conductivity lowered. Alternatively, these may be appropriately combined. However, the second electrode needs to be electrically connected to a portion of the second compound semiconductor layer through which a current flows due to current confinement.

Examples of a method for forming various compound semiconductor layers constituting the light emitting element include a metal organic chemical vapor deposition method (MOCVD method or MOVPE method), a molecular beam epitaxy method (MBE method), a hydride vapor deposition method in which a halogen contributes to transportation or a reaction, and the like. Here, examples of an organic gallium source in the MOCVD method include trimethyl gallium (TMG) and triethyl gallium (TEG). Examples of a nitrogen source gas include an ammonia gas and hydrazine. In forming a GaN-based compound semiconductor layer having n-type conductivity, for example, silicon (Si) only needs to be added as an n-type impurity (n-type dopant). In forming a GaN-based compound semiconductor layer having p-type conductivity, for example, magnesium (Mg) only needs to be added as a p-type impurity (p-type dopant). In a case where aluminum (Al) or indium (In) is contained as a constituent atom of the GaN-based compound semiconductor layer, trimethyl aluminum (TMA) only needs to be used as an Al source, and trimethyl indium (TMI) only needs to be used as an In source. Moreover, a monosilane gas ($SiH_4$ gas) only needs to be used as a Si source, and biscyclopentadienyl magnesium, methyl cyclopentadienyl magnesium, or biscyclopentadienyl magnesium ($Cp_2Mg$) only needs to be used as a Mg source. Note that examples of the n-type impurity (n-type dopant) further include Ge, Se, Sn, C, Te, S, O, Pd, and Po in addition to Si, and examples of the p-type impurity (p-type dopant) further include Zn, Cd, Be, Ca, Ba, C, Hg, and Sr in addition to Mg.

A first electrode electrically connected to the first compound semiconductor layer is formed, and the second electrode is formed in contact with the second compound semiconductor layer. The first electrode is formed in contact with the first compound semiconductor layer or is electrically connected to the first compound semiconductor layer via a substrate. The first electrode may include a metal or an alloy, and the second electrode may include a transparent conductive material. By constituting the second electrode by a transparent conductive material, a current can be spread in a lateral direction (in-plane direction of the second compound semiconductor layer), and a current can be supplied to an element region efficiently. The second electrode is preferably formed on the second surface of the second compound semiconductor layer, and the second light reflecting layer is preferably formed on the second electrode. Here, the "element region" refers to a region into which a confined current is injected, a region in which light is confined by a difference in refractive index or the like, a region where laser oscillation occurs in a region sandwiched between the first light reflecting layer and the second light reflecting layer, or a region actually contributing to laser oscillation in the region sandwiched between the first light reflecting layer and the second light reflecting layer.

In the light emitting element of the present disclosure including various preferred embodiments described above, light generated in the active layer may be emitted to the outside via the second light reflecting layer (hereinafter, referred to as "light emitting element of a second light reflecting layer emission type" for convenience) or may be emitted to the outside via the first light reflecting layer (hereinafter, referred to as "light emitting element of a first light reflecting layer emission type" for convenience) Note that the substrate (substrate for manufacturing a light emitting element) may be removed in some cases in the light emitting element of the first light reflecting layer emission type. In a case where the substrate (substrate for manufacturing a light emitting element) is removed, the second light reflecting layer may be fixed to a supporting substrate. The light emitting element may be constituted by a surface emitting laser element (vertical cavity laser (VCSEL)) that emits light from a top surface of the first compound semiconductor layer via the first light reflecting layer or a surface emitting laser element that emits light from a top surface of the second compound semiconductor layer via the second light reflecting layer.

In a case where the substrate (substrate for manufacturing a light emitting element) is removed, for example, it is only required to form the first light reflecting layer and the first compound semiconductor layer on the substrate, to sequentially form the active layer, the second compound semiconductor layer, the second electrode, and the second light reflecting layer on the first compound semiconductor layer (including formation of the light absorbing material layers), and then to remove the substrate using the first light reflecting layer as a stopper layer. Specifically, for example, it is only required to form the first light reflecting layer and the first compound semiconductor layer on the substrate, to sequentially form the active layer, the second compound semiconductor layer, the second electrode, and the second light reflecting layer (including formation of the light absorbing material layers) on the first compound semiconductor layer, subsequently to fix the second light reflecting layer to the supporting substrate, and then to remove the substrate using the first light reflecting layer as a stopper layer to expose the first compound semiconductor layer (the first surface of the first compound semiconductor layer) and the first light reflecting layer. Moreover, it is only required to form the first electrode on the first compound semiconductor layer (the first surface of the first compound semiconductor layer). Alternatively, if the removal amount is controlled on the basis of a removal rate (polishing rate) of the substrate, the stopper layer does not have to be used.

The substrate (substrate for manufacturing a light emitting element) can be removed on the basis of a chemical/mechanical polishing method (CMP method). Incidentally, first, by removing a part of the substrate or reducing the thickness of the substrate by a wet etching method using an alkali aqueous solution such as a sodium hydroxide aqueous solution or a potassium hydroxide aqueous solution, an ammonia solution+a hydrogen peroxide solution, a sulfuric acid solution+a hydrogen peroxide solution, a hydrochloric acid solution+a hydrogen peroxide solution, a phosphoric acid solution+a hydrogen peroxide solution, or the like, a dry etching method, a lift-off method using a laser, a mechanical polishing method, or the like, or a combination thereof, and subsequently performing a chemical/mechanical polishing method, it is only required to expose the first compound semiconductor layer (the first surface of the first compound semiconductor layer) and the first light reflecting layer.

Examples of the substrate (substrate for manufacturing a light emitting element) include a GaN substrate, a sapphire substrate, a GaAs substrate, a SiC substrate, an alumina substrate, a ZnS substrate, a ZnO substrate, an AlN substrate, a LiMgO substrate, a LiGaO$_2$ substrate, a MgAl$_2$O$_4$ substrate, an InP substrate, a Si substrate, and a substrate having an underlying layer or a buffer layer formed on a surface (main surface) of each of these substrates. In a case where a GaN-based compound semiconductor layer is formed on a substrate, use of a GaN substrate is preferable because of a low defect density. It is known that the GaN substrate changes characteristics thereof among a polar characteristic, a nonpolar characteristic, and a semipolar characteristic depending on a growth surface, but any main surface of the GaN substrate can be used for forming the compound semiconductor layer. Furthermore, regarding the main surfaces of these substrates, depending on a crystal structure (for example, a cubic type, a hexagonal type, or the like), a crystal orientation plane such as a so-called surface A, B, C, R, M, N, or S, planes obtained by making these planes offset in a specific direction, and the like can also be used.

For example, it is only required to constitute the supporting substrate by any one of the various substrates exemplified as the substrate for manufacturing a light emitting element. Alternatively, the supporting substrate can be constituted by an insulating substrate, a semiconductor substrate including Si, SiC, Ge, or the like, a metal substrate, or an alloy substrate. However, a conductive substrate is preferably used. Alternatively, a metal substrate or an alloy substrate is preferably used from a viewpoint of a mechanical characteristic, elastic deformation, a plastic deformation property, a heat radiation property, or the like. As the thickness of the supporting substrate, for example, 0.05 mm to 0.5 mm can be exemplified. As a method for fixing the second light reflecting layer to the supporting substrate, a known method such as a solder bonding method, a room temperature bonding method, a bonding method using an adhesive tape, or a bonding method using wax bonding can be used. However, the solder bonding method or the room temperature bonding method is desirably employed from a viewpoint of ensuring conductivity. For example, in a case where a silicon semiconductor substrate which is a conductive substrate is used as the supporting substrate, a method capable of bonding at a low temperature of 400° C. or lower is desirably employed in order to suppress warpage due to a difference in a thermal expansion coefficient. In a case where a GaN substrate is used as the supporting substrate, a bonding temperature may be 400° C. or higher.

In a case where the substrate is removed in the light emitting element of the first light reflecting layer emission type, as a disposition state of the first light reflecting layer and the first electrode on the first surface of the first compound semiconductor layer, the first light reflecting layer and the first electrode may be in contact with each other, or the first light reflecting layer and the first electrode may be separated from each other. In some cases, the first electrode may be formed even on an edge portion of the first light reflecting layer, or the first light reflecting layer may be formed even on an edge portion of the first electrode. Here, in a case where the first light reflecting layer is formed even on an edge portion of the first electrode, the first electrode needs to have an opening having a certain size in order to prevent absorption of fundamental mode light of laser oscillation as much as possible. The size of the opening varies depending on the wavelength of the fundamental mode and the optical confinement structure in a lateral direction (in-plane direction of the first compound semiconductor layer), and therefore is not limited, but is preferably approximately on the order of several times the oscillation wavelength Ao. Alternatively, the first light reflecting layer and the first electrode are separated from each other, in other words, have an offset. A separation distance may be within 1 mm.

Moreover, in the light emitting element of the present disclosure including the various preferred embodiments described above, surface roughness Ra of the second compound semiconductor layer (the second surface of the second compound semiconductor layer) is preferably 1.0 nm or less. The surface roughness Ra is defined in JIS B-610:2001, and can be specifically measured on the basis of observation based on AFM and cross-sectional TEM.

For example, the first electrode desirably has a single layer configuration or a multilayer configuration including at least one metal (including an alloy) selected from the group consisting of gold (Au), silver (Ag), palladium (Pd), platinum (Pt), nickel (Ni), Ti (titanium), vanadium (V), tungsten (W), chromium (Cr), Al (aluminum), Cu (copper), Zn (zinc), tin (Sn), and indium (In). Specific examples thereof include Ti/Au, Ti/Al, Ti/Al/Au, Ti/Pt/Au, Ni/Au, Ni/Au/Pt, Ni/Pt, Pd/Pt, and Ag/Pd. Note that the further forward a layer in "/" of the multilayer configuration is located, the closer to the active layer the layer is located. This applies to the following description similarly. For example, a film of the first electrode can be formed by a PVD method such as a vacuum vapor deposition method or a sputtering method.

Examples of the transparent conductive material constituting the second electrode include an indium-based transparent conductive material [specifically, for example, indium-tin oxide (ITO, including Sn-doped $In_2O_3$, crystalline ITO, and amorphous ITO), indium-zinc oxide (IZO), indium-gallium oxide (IGO), indium-doped gallium-zinc oxide (IGZO and In—GaZnO$_4$), IFO (F-doped $In_2O_3$)], ITiO (Ti-doped $In_2O_3$), InSn, or InSnZnO], a tin-based transparent conductive material [specifically, for example, tin oxide ($SnO_2$), ATO (Sb-doped $SnO_2$), or FTO (F-doped $SnO_2$)], and a zinc-based transparent conductive material [specifically, for example, zinc oxide (ZnO, including Al-doped ZnO and B-doped ZnO), gallium-doped zinc oxide (GZO), and AlMgZnO (aluminum oxide and magnesium oxide-doped zinc oxide). Alternatively, examples of the second electrode include a transparent conductive film having a host layer of gallium oxide, titanium oxide, niobium oxide, antimony oxide, nickel oxide, or the like, and further include a transparent conductive material such as a spinel type oxide or an oxide having an $YbFe_2O_4$ structure. However, the material constituting the second electrode is not limited to the transparent conductive material although depending on a disposition state of the second light reflecting layer and the second electrode. A metal such as palladium (Pd), platinum (Pt), nickel (Ni), gold (Au), cobalt (Co), or rhodium (Rh) can also be used. The second electrode only needs to be constituted by at least one of these materials. For example, a film of the second electrode can be formed by a PVD method such as a vacuum vapor deposition method or a sputtering method. Alternatively, a low-resistance semiconductor layer can also be used as the transparent electrode layer. In this case, specifically, an n-type GaN-based compound semiconductor layer can also be used. Moreover, in a case where a p-type layer is adjacent to the n-type GaN-based compound semiconductor layer, the electric resistance of an interface can also be lowered by bonding both layers to each other via a tunnel junction.

A pad electrode may be disposed on the first electrode or the second electrode in order to connect the first electrode or the second electrode to an external electrode or circuit electrically. The pad electrode desirably has a single layer configuration or a multilayer configuration containing at least one metal selected from the group consisting of titanium (Ti), aluminum (Al), platinum (Pt), gold (Au), nickel (Ni), and palladium (Pd). Alternatively, the pad electrode may have a multilayer configuration such as a Ti/Pt/Au multilayer configuration, a Ti/Au multilayer configuration, a Ti/Pd/Au multilayer configuration, a Ti/Pd/Au multilayer configuration, a Ti/Ni/Au multilayer configuration, or a Ti/Ni/Au/Cr/Au multilayer configuration. In a case where the first electrode includes an Ag layer or an Ag/Pd layer, a cover metal layer including, for example, Ni/TiW/Pd/TiW/Ni is preferably formed on a surface of the first electrode, and a pad electrode having a multilayer configuration of Ti/Ni/Au or a multilayer configuration of Ti/Ni/Au/Cr/Au is preferably formed on the cover metal layer, for example.

The light reflecting layer (distributed Bragg reflector layer, (DBR layer)) is constituted by, for example, a semiconductor multilayer film or a dielectric multilayer film. Examples of a dielectric material include an oxide of Si, Mg, Al, Hf, Nb, Zr, Sc, Ta, Ga, Zn, Y, B, Ti, or the like, a nitride (for example, $SiN_X$, $AlN_X$, AlGaN, $GaN_X$, $BN_X$, or the like), a fluoride, and the like. Specific examples thereof include $SiO_X$, $TiO_X$, $NbO_X$, $ZrO_X$, $TaO_X$, $ZnO_X$, $AlO_X$, $HfO_X$, $SiN_X$, $AlN_X$, and the like. In addition, the light reflecting layer can be obtained by alternately laminating two or more kinds of dielectric films including dielectric materials having different refractive indices among these dielectric materials. For example, a multilayer film such as $SiO_X/SiN_Y$, $SiO_X/NbO_Y$, $SiO_X/ZrO_Y$, or $SiO_X/AlN_Y$ is preferable. In order to obtain desired light reflectance, it is only required to appropriately select a material constituting each dielectric film, a film thickness, the number of laminated layers, and the like. The thickness of each dielectric film can be appropriately adjusted depending on a material used and the like, and is determined by the oscillation wavelength $\lambda_0$ and the refractive index n of the material used at the oscillation wavelength $\lambda_0$. Specifically, the thickness of each dielectric film is preferably an odd multiple of $\lambda_0/(4n)$. For example, in a case where the light reflecting layer is constituted by $SiO_X/NbO_Y$ in a light emitting element having the oscillation wavelength $\lambda_0$ of 410 nm, the thickness of each dielectric film may be about 40 nm to 70 nm. The number of laminated layers may be 2 or more, and preferably about 5 to 20. The total thickness of the light reflecting layer may be, for example, about 0.6 μm to 1.7 μm.

Alternatively, the first light reflecting layer desirably includes a dielectric film containing at least N (nitrogen) atoms. Moreover, the dielectric film containing N atoms is more desirably formed as the uppermost layer of the dielectric multilayer film. Alternatively, the first light reflecting layer is desirably coated with a dielectric material layer containing at least N (nitrogen) atoms. Alternatively, by subjecting a surface of the first light reflecting layer to a nitriding treatment, the surface of the first light reflecting layer is desirably formed into a layer containing at least N (nitrogen) atoms (hereinafter referred to as "surface layer" for convenience). The thickness of the dielectric film, the dielectric material layer, or the surface layer containing at least N atoms is preferably an odd multiple of $\lambda_0/(4n)$. Specific examples of a material constituting the dielectric film or the dielectric material layer containing at least N atoms include $SiN_X$ and $SiO_XN_Z$. In this way, when a compound semiconductor layer coating the first light reflecting layer is formed by forming a dielectric film, a dielectric material layer, or a surface layer containing at least N atoms, it is possible to improve a deviation between a crystal axis of the compound semiconductor layer coating the first light reflecting layer and a crystal axis of a substrate for manufacturing a light emitting element, and to enhance the quality of a light emitting structure to be a resonator.

The light reflecting layer can be formed on the basis of a known method. Specific examples of the method include a PVD method such as a vacuum vapor deposition method, a sputtering method, a reactive sputtering method, an ECR plasma sputtering method, a magnetron sputtering method, an ion beam assisted vapor deposition method, an ion plating method, or a laser ablation method; various CVD methods; a coating method such as a spraying method, a spin coating method, or a dipping method; a method combining two or more of these methods; a method combining these methods with one or more selected from the group consisting of a whole or partial pre-treatment, irradiation with an inert gas (Ar, He, Xe, or the like) or plasma, irradiation with an oxygen gas, an ozone gas, or plasma, an oxidation treatment (heat treatment), and an exposure treatment, and the like.

The size and shape of the light reflecting layer are not particularly limited as long as the light reflecting layer coats an element region. Specific examples of the planar shape of an opening formed in the element region, the first light reflecting layer, the second light reflecting layer, or the current confinement layer include circular, elliptical, rectangular, and polygonal (triangular, quadrangular, hexagonal, and the like) shapes. Furthermore, the planar shape of the first electrode may be annular. The planar shape of an opening formed in the element region, the first light reflecting layer, the second light reflecting layer, or the current confinement layer is desirably similar to the planar shape of an inner annular portion of the annular first electrode. In a case of a circular shape, the diameter is preferably about 2 µm to 70 µm.

A side surface and an exposed surface of the light emitting structure may be coated with the coating layer. The coating layer can be formed on the basis of a known method. The refractive index of a material constituting the coating layer is preferably smaller than the refractive index of a material constituting the light emitting structure. Examples of an insulating material constituting the coating layer include a $SiO_X$-based material containing $SiO_2$, a $SiN_X$-based material, a $SiO_XN_Z$-based material, $TaO_X$, $ZrO_X$, $AlN_X$, $AlO_X$, and $GaO_X$, and further include an organic material such as a polyimide resin. Examples of a method for forming the coating layer include a PVD method such as a vacuum vapor deposition method or a sputtering method, and a CVD method. The coating layer can also be formed on the basis of a coating method.

Example 1

Example 1 relates to the light emitting element of the present disclosure.

As illustrated in the schematic partial cross-sectional view of FIG. 1A, each of the light emitting element of Example 1 and light emitting elements of Example 2 to Example 4 described later is specifically a surface emitting laser element (vertical cavity laser (VCSEL)),
including a laminated structure obtained by laminating:
a first light reflecting layer 41;
a light emitting structure 20; and
a second light reflecting layer 42, in which
the light emitting structure 20 is formed by laminating:
from the first light reflecting layer side,
a first compound semiconductor layer 21;
an active layer (light emitting layer) 23; and
a second compound semiconductor layer 22, and
in the laminated structure, at least two light absorbing material layers 51, preferably at least four light absorbing material layers 51, and specifically in Example 1, twenty light absorbing material layers 51 are formed in parallel to a virtual plane occupied by the active layer 23. Note that only the two light absorbing material layers 51 are illustrated in the drawing in order to simplify the drawing.

In Example 1, each of the first compound semiconductor layer 21, the active layer 23, and the second compound semiconductor layer 22 (light emitting laminate 20) includes a GaN-based compound semiconductor material. Specifically, the first compound semiconductor layer 21 is constituted by an n-GaN layer, the active layer 23 has a five-layered multiple quantum well structure obtained by laminating an $In_{0.04}Ga_{0.96}N$ layer (barrier layer) and an $In_{0.16}Ga_{0.84}N$ layer (well layer), and the second compound semiconductor layer 22 is constituted by a p-GaN layer. Furthermore, a first electrode 31 includes Ti/Pt/Au, the second electrode 32 includes a transparent conductive material, specifically ITO, the pad electrode 33 includes Ti/Pd/Au or Ti/Pd/Au, and each of the first light reflecting layer 41 and the second light reflecting layer 42 has a laminated structure of a SiN layer and a $SiO_2$ layer (total number of laminated dielectric films: twenty layers). A region of the first light reflecting layer 41 from a first surface 21a of the first compound semiconductor layer 21 to a certain depth, the light emitting laminate 20 (the first compound semiconductor layer 21, the active layer 23, and the second compound semiconductor layer 22), and a region of the second light reflecting layer 42 from a second surface 22b of the second compound semiconductor layer 22 to a certain depth constitute a resonator.

The oscillation wavelength (desired oscillation wavelength emitted from the light emitting element) $\lambda_0$ is 450 nm. Each of the twenty light absorbing material layers 51 includes a compound semiconductor material having a narrower band gap than a compound semiconductor constituting the light emitting structure 20, specifically includes n-$In_{0.2}Ga_{0.8}N$, and is formed in the first compound semiconductor layer 21. The thickness of the light absorbing material layers 51 is $\lambda_0/(4 \cdot n_{eq})$ or less, and specifically 3 nm. Furthermore, the optical absorption coefficient of the light absorbing material layers 51 is twice or more, and specifically $1 \times 10^3$ times the optical absorption coefficient of the first compound semiconductor layer 21 constituted by an n-GaN layer.

Furthermore, the light absorbing material layers 51 are located at a minimum amplitude portion generated in a standing wave of light formed in the laminated structure, and the active layer 23 is located at a maximum amplitude portion generated in a standing wave of light formed in the laminated structure. A distance between the center of the active layer 23 in a thickness direction thereof and the center of the light absorbing material layer 51 adjacent to the active layer 23 in a thickness direction thereof is 46.5 nm. Moreover, when an equivalent refractive index of the whole of the two light absorbing material layers 51 and a portion of the laminated structure located between the light absorbing material layers 51 (specifically, the first compound semiconductor layer 21 in Example 1) is represented by $n_{eq}$, and a distance between the light absorbing material layers 51 is represented by $L_0$, $$0.9 \times \{(m \cdot \lambda_0)/(2 \cdot n_{eq})\} \leq L_0 \leq 1.1 \times \{(m \cdot \lambda_0)/(2 \cdot n_{eq})\}$$

is satisfied. Here, m is 1 or any integer of 2 or more including 1. However, in Example 1, m=1. Therefore, a distance between the adjacent light absorbing material layers 51 satisfies, in all the plurality of light absorbing material layers 51 (twenty light absorbing material layers 51), $$0.9 \times \{(m \cdot \lambda_0)/(2 \cdot n_{eq})\} \leq L_0 \leq 1.1 \times \{(m \cdot \lambda_0)/(2 \cdot n_{eq})\}.$$

Specifically, the value of the equivalent refractive index $n_{eq}$ is 2.42, and when m=1, specifically, $$L_0 = 1 \times 450/(2 \times 2.42)$$

=93.0 nm is satisfied. Note that m may be an any integer of 2 or more in some of the light absorbing material layers 51 in the twenty light absorbing material layers 51.

The first light reflecting layer 41 and the first compound semiconductor layer 21 are disposed on a substrate 11 having conductivity (a substrate for manufacturing a light emitting element, specifically, an n-GaN substrate) (specifically, on a first surface 11a of the substrate 11). Furthermore, light generated in the active layer 23 is emitted to the outside via the second light reflecting layer 42. In other words, the light emitting element of Example 1 is a light emitting element of a second light reflecting layer emission type, and is specifically constituted by a surface emitting laser element that emits light from a top surface of the second compound semiconductor layer 22 via the second light reflecting layer 42 (vertical cavity laser (VCSEL)).

The first electrode 31 is disposed on an outer surface (second surface 11b) of the substrate 11. The first compound semiconductor layer 21 and the first light reflecting layer 41 constituted by a multilayer film are formed on the first surface 11a facing the second surface 11b of the substrate 11.

In the light emitting element of Example 1, a current confinement layer 24 including an insulating material such as $SiO_2$ is formed between the second electrode 32 and the second compound semiconductor layer 22. A circular opening 25 is formed in the current confinement layer 24, and the second compound semiconductor layer 22 is exposed to a bottom of the opening 25.

The second electrode 32 is formed on the second surface 22b of the second compound semiconductor layer 22, and the second light reflecting layer 42 constituted by a multilayer film is formed on the second electrode 32. Specifically, the second electrode 32 is formed so as to cover a portion extending from the second surface 22b of the second compound semiconductor layer 22 to a top surface of the current confinement layer 24, and the second light reflecting layer 42 is formed on the second electrode 32. Moreover, the pad electrode 33 for electrical connection to an external electrode or circuit is connected to an edge portion of the second electrode 32. The planar shape of the element region is circular, and the planar shape of the opening 25 formed in the first electrode 31, the first light reflecting layer 41, the second light reflecting layer 42, or the current confinement layer 24 is also circular. The first light reflecting layer 41 and the second light reflecting layer 42 each have a multilayer structure, but are each represented by one layer for simplifying the drawings. Formation of the current confinement layer 24 is not indispensable.

Figure 3A:
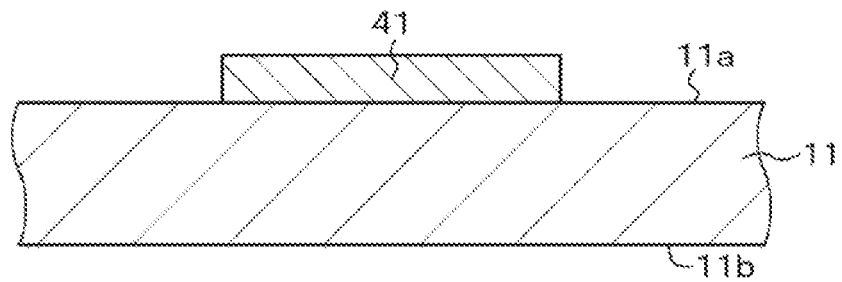
FIGS. 3A, 3B, and 3C are schematic partial end views of a laminated structure or the like for explaining a method for manufacturing the light emitting element of Example 1.

Hereinafter, with reference to FIGS. 3A, 3B, and 3C which are schematic partial end views of the laminated structure or the like, a method for manufacturing the light emitting element of Example 1 will be described.

[Step-100]

First, the first light reflecting layer 41 constituted by a multilayer film and having a protruding shape is formed on the first surface 11a of the substrate 11 for manufacturing a light emitting element. Specifically, the patterned first light reflecting layer 41 constituted by a multilayer film is formed on the first surface 11a of the substrate 11 for manufacturing a light emitting element constituted by a GaN substrate on the basis of a known method. In this way, the structure illustrated in FIG. 3A can be obtained. The shape of the first light reflecting layer 41 is a disk shape. However, the shape of the first light reflecting layer 41 is not limited thereto.

[Step-110]

Next, on the substrate 11 for manufacturing a light emitting element including the first light reflecting layer 41,
the light emitting structure 20 obtained by laminating:
the first compound semiconductor layer 21 including a GaN-based compound semiconductor and having the first surface 21a and the second surface 21b facing the first surface 21a;
the active layer (light emitting layer) 23 including a GaN-based compound semiconductor and in contact with the second surface 21b of the first compound semiconductor layer 21; and
the second compound semiconductor layer 22 including a GaN-based compound semiconductor and having the first surface 22a and the second surface 22b facing the first surface 22a, the first surface 22a being in contact with the active layer 23,
is formed. Specifically, the first compound semiconductor layer 21 including n-GaN is formed by lateral growth using a laterally epitaxial growth method such as an ELO method. At this time, the twenty light absorbing material layers 51 are formed together in the first compound semiconductor layer 21. Moreover, the active layer 23 and the second compound semiconductor layer 22 are formed on the first compound semiconductor layer 21 on the basis of an epitaxial growth method to obtain the light emitting structure 20.

[Step-120]

Figure 3B:
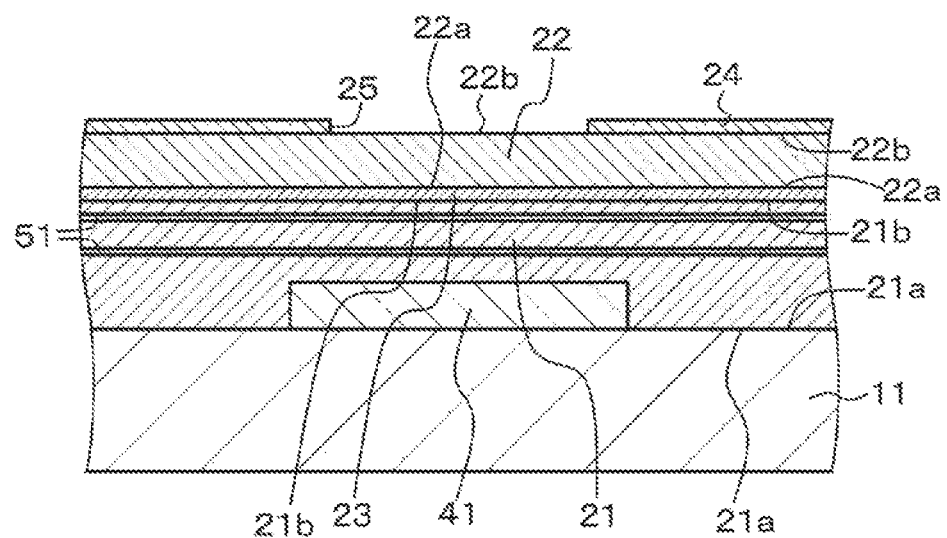
Figure 3C:
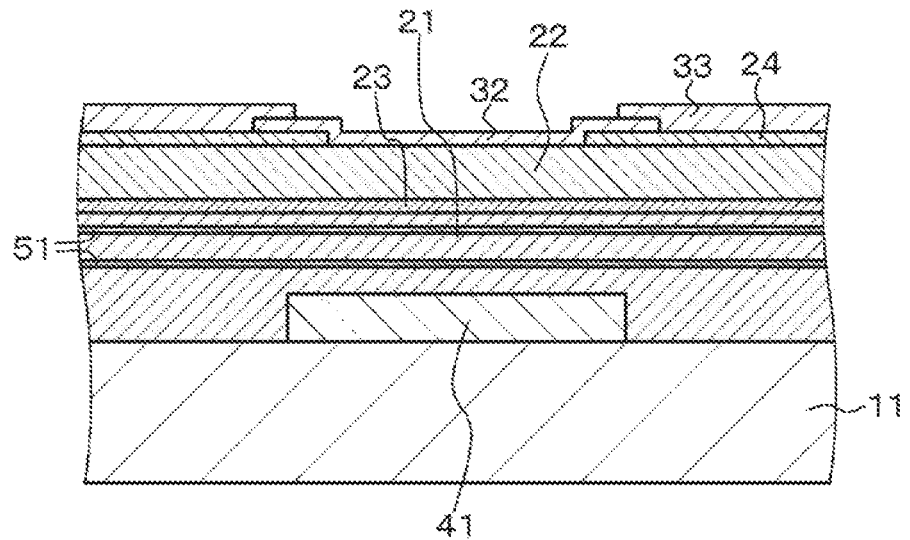

Thereafter, on the second surface 22b of the second compound semiconductor layer 22, the current confinement layer 24 having the opening 25 and including $SiO_2$ is formed on the basis of a known method (see FIG. 3B).

[Step-130]

Subsequently, the second electrode 32 is formed so as to cover a portion extending from the second surface 22b of the second compound semiconductor layer 22 exposed to a bottom surface of the opening 25 to a top surface of the current confinement layer 24, for example, on the basis of a lift-off method. Moreover, the pad electrode 33 is formed on the basis of a known method. In this way, the structure illustrated in FIG. 3C can be obtained. Subsequently, the second light reflecting layer 42 is formed so as to cover a portion extending from a top surface of the second electrode 32 to a top surface of the pad electrode 33 on the basis of a known method.

[Step-140]

Thereafter, on an outer surface (second surface 11b) of the substrate 11 for manufacturing a light emitting element, the first electrode 31 and the like are formed on the basis of a known method. In this way, the structure illustrated in FIG. 1A can be obtained. Then, by further performing so-called element separation, the light emitting element is separated. A side surface and an exposed surface of the laminated structure are coated with a coating layer including an insulating material such as $SiO_2$. Then, by performing packaging or sealing, the light emitting element of Example 1 can be completed.

In a case where the light emitting structure includes a GaAs-based compound semiconductor layer, the length L of a resonator is usually as short as 1 µm or less, and one kind (one wavelength) of laser light in a longitudinal mode is usually emitted from a surface emitting laser element. Therefore, it is possible to accurately control an oscillation wavelength of the laser light in a longitudinal mode emitted from the surface emitting laser element. Meanwhile, in a case where the light emitting structure includes a GaN-based compound semiconductor layer, the length L of a resonator is usually as long as several times the wavelength of laser light emitted from a surface emitting laser element. Therefore, a plurality of kinds of laser light in longitudinal modes can be emitted from the surface emitting laser element, and it is difficult to accurately control an oscillation wavelength of the laser light that can be emitted from the surface emitting laser element.

Figure 2:
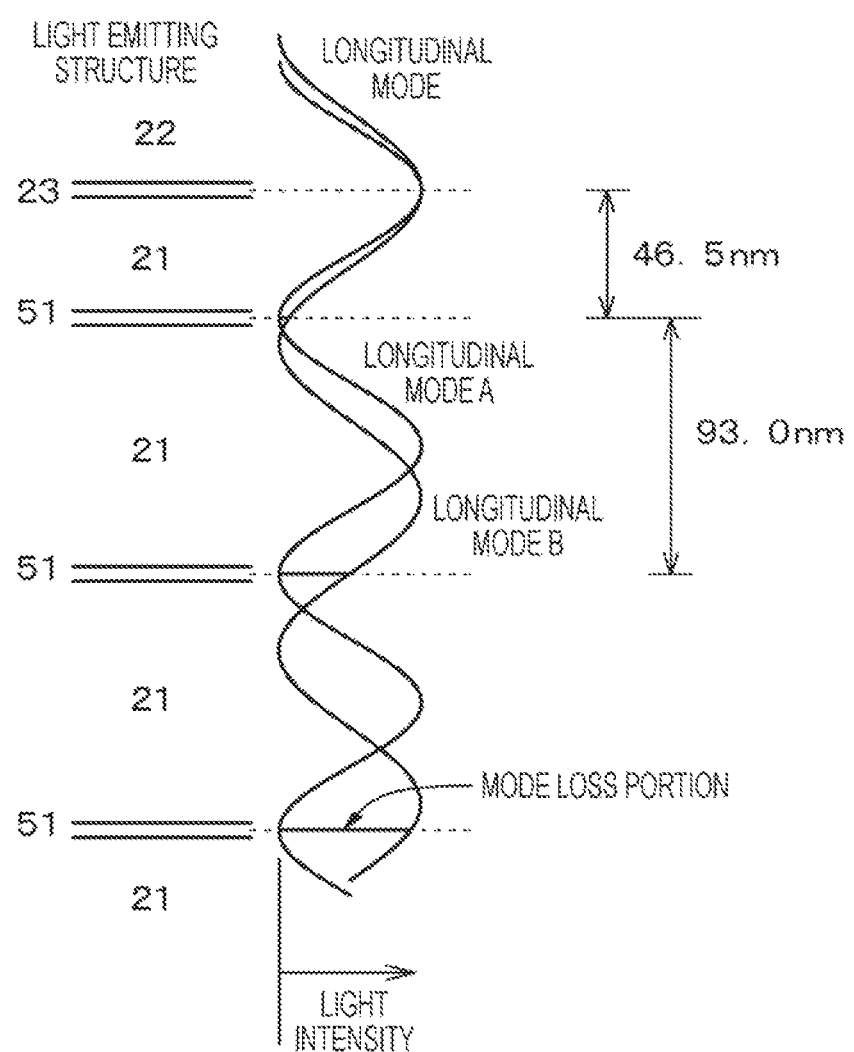
FIG. 2 is a diagram obtained by superimposing a schematic partial cross-sectional view of the light emitting element of Example 1 with two longitudinal modes of longitudinal mode A and longitudinal mode B.

In a case where a plurality of longitudinal modes is generated within a gain spectrum determined by the active layer 23, this case is schematically illustrated in FIG. 2. Note that FIG. 2 illustrates two longitudinal modes of longitudinal mode A and longitudinal mode B. In addition, in this case, it is assumed that the light absorbing material layers 51 are located at the minimum amplitude portion of the longitudinal mode A and are not located at the minimum amplitude portion of the longitudinal mode B. In this case, a mode loss of the longitudinal mode A is minimized, but a mode loss of the longitudinal mode B is large. In FIG. 2, the mode loss portion of the longitudinal mode B is schematically indicated by a solid line. Therefore, oscillation occurs easily in the longitudinal mode A than in the longitudinal mode B. Therefore, by using such a structure, in other words, by controlling the positions and the periods of the light absorbing material layers 51, it is possible to stabilize a specific longitudinal mode and to make oscillation easier. Meanwhile, it is possible to increase a mode loss for another undesirable longitudinal mode. Therefore, it is possible to suppress oscillation in another undesirable longitudinal mode.

As described above, in the light emitting element of Example 1, since at least two light absorbing material layers are formed in the laminated structure, among a plurality of kinds of laser light in longitudinal modes that can be emitted from a surface emitting laser element, oscillation of undesired laser light in a longitudinal mode can be suppressed. As a result, it is possible to accurately control an oscillation wavelength of emitted laser light.

Note that in [Step 100], the first light reflecting layer 41 constituted by a multilayer film may be formed on the first surface 11a of the substrate 11 for manufacturing a light emitting element constituted by a GaN substrate on the basis of an epitaxial growth method. Note that in principle, patterning of the first light reflecting layer 41 is unnecessary. In this way, finally, a light emitting element having the structure illustrated in the schematic partial cross-sectional view of FIG. 1B can be obtained.

Example 2

Example 2 is a modification of Example 1. In Example 1, each of the light absorbing material layers 51 included a compound semiconductor material having a narrower band gap than the compound semiconductor constituting the light emitting structure 20. Meanwhile, in Example 2, each of the ten light absorbing material layers 51 included a compound semiconductor material doped with impurities, specifically, a compound semiconductor material (specifically, n-GaN: Si) having an impurity concentration (impurity: Si) of $1 \times 10^{19}/cm^3$. Furthermore, in Example 2, the oscillation wavelength $\lambda_0$ was 515 nm. Note that the composition of the active layer 23 is $In_{0.3}Ga_{0.7}N$. In Example 2, m=1, the value of $L_0$ is 107 nm, a distance between the center of the active layer 23 in a thickness direction thereof and the center of the light absorbing material layer 51 adjacent to the active layer 23 in a thickness direction thereof is 53.5 nm, and the thickness of the light absorbing material layers 51 is 3 nm. The configuration and structure of the light emitting element of Example 2 can be similar to those of the light emitting element of Example 1 except for the above points, and therefore detailed description will be omitted. Note that m can be an any integer of 2 or more in some of the light absorbing material layers 51 in the ten light absorbing material layers 51.

Example 3

Example 3 is a modification of Example 1. In Example 3, five light absorbing material layers (referred to as "first light absorbing material layer" for convenience) had a similar configuration to the light absorbing material layers 51 of Example 1, in other words, included $n-In_{0.3}Ga_{0.7}N$. Moreover, in Example 3, one light absorbing material layer (referred to as "second light absorbing material layer" for convenience) included a transparent conductive material. Specifically, the second light absorbing material layer also served as the second electrode 32 including ITO. In Example 3, the oscillation wavelength $\lambda_0$ was 450 nm. Furthermore, m=1 or 2. In a case of m=1, the value of $L_0$ is 93.0 nm, a distance between the center of the active layer 23 in a thickness direction thereof and the center of the first light absorbing material layer adjacent to the active layer 23 in a thickness direction thereof is 46.5 nm, and the thickness of the five-layered first light absorbing material layer is 3 nm. In other words, in the five-layered first light absorbing material layer, $$0.9 \times \{(m \cdot \lambda_0)/(2 \cdot n_{eq})\} \leq L_0 \leq 1.1 \times \{(m \cdot \lambda_0)/(2 \cdot n_{eq})\}$$

is satisfied. Furthermore, in each of the first light absorbing material layer adjacent to the active layer 23 and the second light absorbing material layer, m was set to 2. In other words, $$0.9 \times \{(2 \cdot \lambda_0)/(2 \cdot n_{eq})\} \leq L_0 \leq 1.1 \times \{(2 \cdot \lambda_0)/(2 \cdot n_{eq})\}$$

is satisfied. The optical absorption coefficient of the one-layered second light absorbing material layer also serving as the second electrode 32 is 2000 $cm^{-1}$, the thickness thereof is 30 nm, and a distance from the active layer 23 to the second light absorbing material layer is 139.5 nm. The configuration and structure of the light emitting element of Example 3 can be similar to those of the light emitting element of Example 1 except for the above points, and therefore detailed description will be omitted. Note that m can be an any integer of 2 or more in some first light absorbing material layers of the five-layered first light absorbing material layer. Note that the number of the light absorbing material layers 51 can be set to one unlike Example 1. Also in this case, a positional relationship between the second light absorbing material layer also serving as the second electrode 32 and the light absorbing material layer 51 needs to satisfy the following formula.

$$0.9 \times \{(m \cdot \lambda_0)/(2 \cdot n_{eq})\} \leq L_0 \leq 1.1 \times \{(m \cdot \lambda_0)/(2 \cdot n_{eq})\}$$

Example 4

Example 4 is a modification of Examples 1 to 3. A light emitting element of Example 4 is more specifically constituted by a surface emitting laser element that emits light from a top surface of the first compound semiconductor layer 21 via the first light reflecting layer 41 (vertical cavity laser (VCSEL)).

Figure 4A:
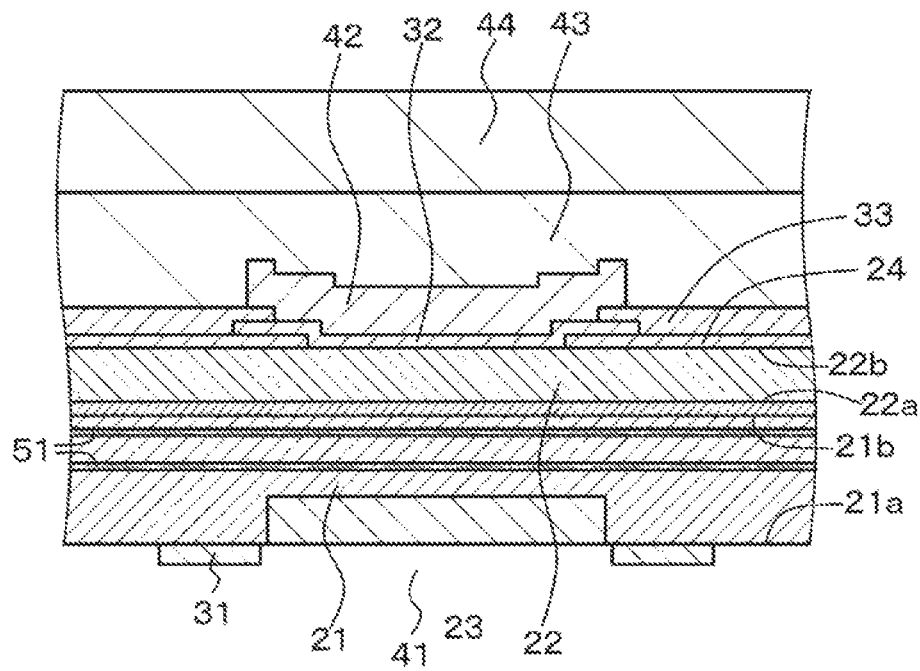
FIGS. 4A and 4B are schematic partial cross-sectional views of a light emitting element of Example 4.

In the light emitting element of Example 4, as illustrated in the schematic partial cross-sectional view of FIG. 4A, the second light reflecting layer 42 is fixed to a supporting substrate 44 constituted by a silicon semiconductor substrate via a bonding layer 43 constituted by a gold (Au) layer or a solder layer containing tin (Sn) on the basis of a solder bonding method.

Hereinafter, a method for manufacturing the light emitting element of Example 4 will be described.

[Step-400]

Figure 1B:
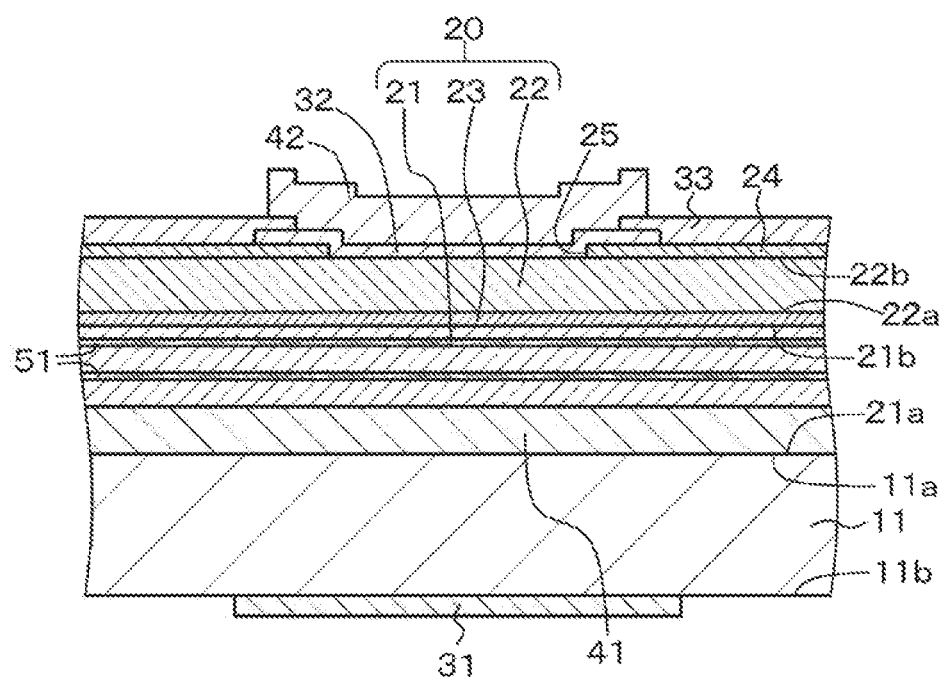

First, for example, by performing similar steps to [step 100] to [step 130] in Example 1, it is possible to obtain the state illustrated in FIGS. 1A and 1B (provided that the first electrode 31 is not formed).

[Step-410]

Thereafter, the second light reflecting layer 42 is fixed to the supporting substrate 44 via the bonding layer 43.

[Step-420]

Subsequently, the substrate 11 for manufacturing a light emitting element is removed to expose the first surface 21a of the first compound semiconductor layer 21 and the first light reflecting layer 41. Specifically, first, the thickness of the substrate 11 for manufacturing a light emitting element is reduced on the basis of a mechanical polishing method, and then the remainder of the substrate 11 for manufacturing a light emitting element is removed on the basis of a CMP method. In this way, the first surface 21a of the first compound semiconductor layer 21 and the first light reflecting layer 41 are exposed.

[Step 430]

Thereafter, the first electrode 31 is formed on the first surface 21a of the first compound semiconductor layer 21. In this way, the light emitting element of Example 4 having the structure illustrated in FIG. 4A can be obtained.

In the manufacture of the light emitting element of Example 4, the substrate for manufacturing a light emitting element is removed in a state where the first light reflecting layer is formed. Therefore, the first light reflecting layer functions as a kind of stopper at the time of removing the substrate for manufacturing a light emitting element. As a result, it is possible to suppress occurrence of variations in removal of the substrate for manufacturing a light emitting element in the plane of the substrate for manufacturing a light emitting element, to further suppress occurrence of variations in the thickness of the first compound semiconductor layer, and to uniform the length of a resonator. As a result, the characteristics of an obtained light emitting element can be stabilized. In addition, a surface (flat surface) of the first compound semiconductor layer at an interface between the first light reflecting layer and the first compound semiconductor layer is flat. Therefore, it is possible to minimize scattering of laser light on the flat surface.

In the example of the light emitting element described above and illustrated in FIG. 4A, an end portion of the first electrode 31 is separated from the first light reflecting layer 41. In other words, the first light reflecting layer 41 and the first electrode 31 are separated from each other. In other words, the first light reflecting layer 41 and the first electrode 31 have an offset from each other, and a separation distance therebetween is within 1 mm, and, specifically for example, 0.05 mm on average. However, the present invention is not limited to such a structure. The end portion of the first electrode 31 may be in contact with the first light reflecting layer 41, or the end portion of the first electrode 31 may be formed so as to cover a top surface of an edge portion of the first light reflecting layer 41.

Figure 4B:
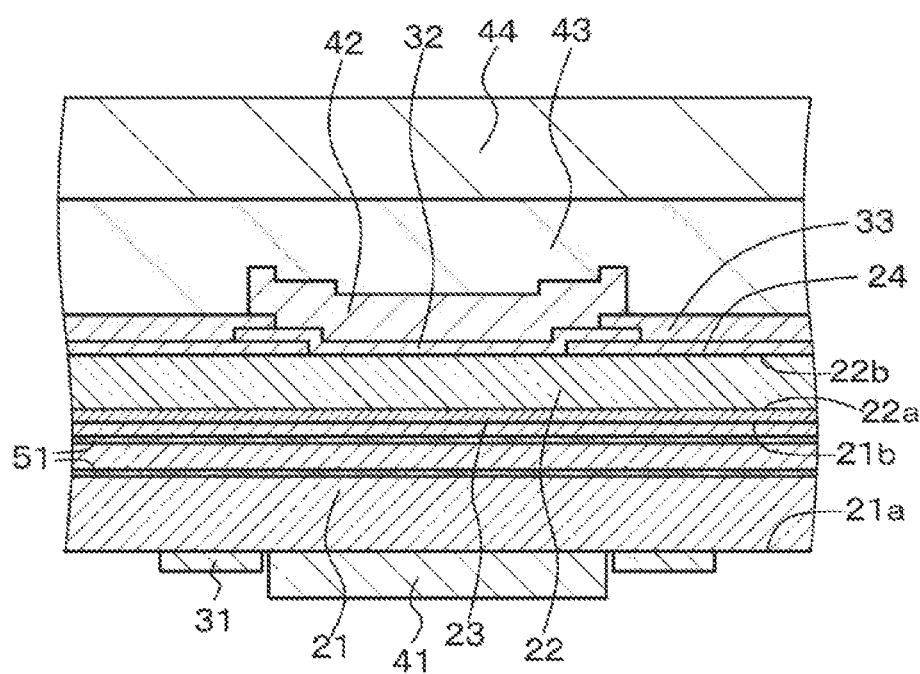

Furthermore, by omitting [step 100] of Example 1, first, for example, similar steps to [step 110] to [step 130] of Example 1 may be performed, and then [step 410] and [step-420] may be performed to expose the first surface 21a of the first compound semiconductor layer 21. Subsequently, the first light reflecting layer 41 and the first electrode 31 may be formed on the first surface 21a of the first compound semiconductor layer 21. FIG. 4B illustrates a schematic partial cross-sectional view of the light emitting element thus obtained.

Figure 5:
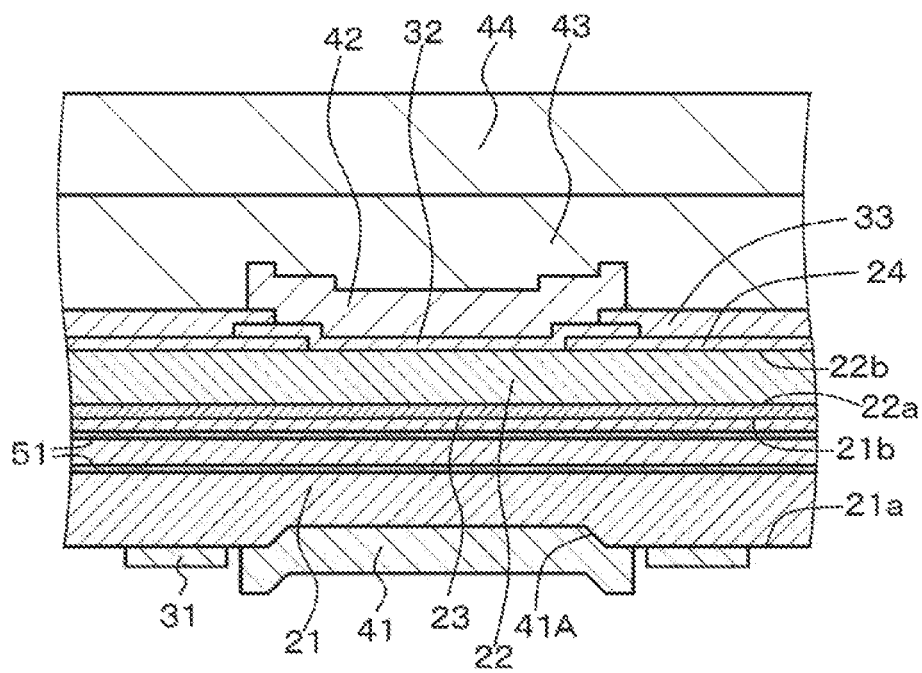
FIG. 5 is a schematic partial cross-sectional view of a modification of the light emitting element of Example 4.
Figure 6A:
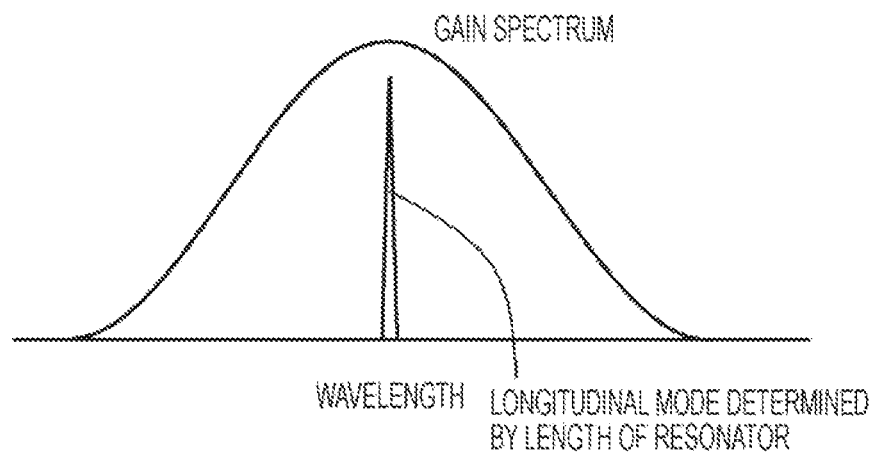
FIGS. 6A and 6B are conceptual diagrams schematically illustrating a longitudinal mode existing in a gain spectrum determined by an active layer.
Figure 6B:
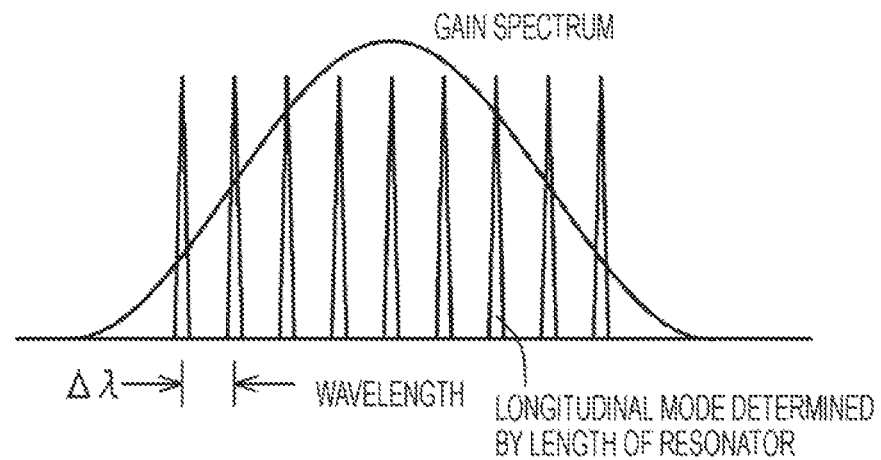

Furthermore, when the first light reflecting layer 41 is formed on the first surface 21a of the first compound semiconductor layer 21, the first compound semiconductor layer 21 may be etched to form a recessed portion on the first surface 21a of the first compound semiconductor layer 21, and the first light reflecting layer 41 may be formed in this recessed portion (see FIG. 5). Note that the inclined portion formed in the first compound semiconductor layer 21 is indicated by reference numeral 41A.

Hitherto, the present disclosure has been described on the basis of the preferable Examples. However, the present disclosure is not limited to these Examples. The configurations and structures of the light emitting element described in Examples are illustrative and can be changed appropriately. The method for manufacturing the light emitting element is also illustrative and can be changed appropriately. In some cases, by appropriately selecting the bonding layer and the supporting substrate, the surface emitting laser element can emit light from a top surface of the second compound semiconductor layer via the second light reflecting layer. By forming the first light reflecting layer and the first electrode and then removing the supporting substrate, a surface emitting laser element that emits light from a top surface of the second compound semiconductor layer via the second light reflecting layer can be completed. Alternatively, by fixing the first light reflecting layer to a second supporting substrate and then removing the supporting substrate to expose the second light reflecting layer, a surface emitting laser element that emits light from the top surface of the second compound semiconductor layer via the second light reflecting layer can be completed.

Note that the present disclosure may have the following configurations.

[A01] <<Light Emitting Element>>

A light emitting element including a laminated structure formed by laminating:

a first light reflecting layer;

a light emitting structure; and a second light reflecting layer, in which the light emitting structure is formed by laminating:

from the first light reflecting layer side, a first compound semiconductor layer;

an active layer; and a second compound semiconductor layer, and in the laminated structure, at least two light absorbing material layers are formed in parallel to a virtual plane occupied by the active layer.

[A02] The light emitting element according to [A01], in which at least four light absorbing material layers are formed.

[A03] The light emitting element according to [A01] or [A02], in which when an oscillation wavelength is represented by $\lambda_0$, an equivalent refractive index of the whole of the two light absorbing material layers and a portion of the laminated structure located between the light absorbing material layers is represented by $n_{eq}$, and a distance between the light absorbing material layers is represented by $L_0$, $$0.9 \times \{(m \cdot \lambda_0)/(2 \cdot n_{eq})\} \leq L_0 \leq 1.1 \times \{(m \cdot \lambda_0)/(2 \cdot n_{eq})\}$$

is satisfied.

Provided that m is 1 or any integer of 2 or more including 1.

[A04] The light emitting element according to any one of [A01] to [A03], in which the light absorbing material layers have a thickness of $\lambda_0/(4 \cdot n_{eq})$ or less.

[A05] The light emitting element according to any one of [A01] to [A04], in which the light absorbing material layers are located at a minimum amplitude portion generated in a standing wave of light formed in the laminated structure.

[A06] The light emitting element according to any one of [A01] to [A05], in which the active layer is located at a maximum amplitude portion generated in a standing wave of light formed in the laminated structure.

[A07] The light emitting element according to any one of [A01] to [A06], in which the light absorbing material layer has an optical absorption coefficient twice or more the optical absorption coefficient of a compound semiconductor constituting the light emitting structure.

[A08] The light emitting element according to any one of [A01] to [A07], in which each of the light absorbing material layers includes at least one selected from the group consisting of a compound semiconductor material having a narrower band gap than a compound semiconductor constituting the light emitting structure, a compound semiconductor material doped with impurities, a transparent conductive material, and a light reflecting layer constituting material having a light absorbing characteristic.

[A09] The light emitting element according to any one of [A01] to [A08], in which each of the first compound semiconductor layer, the active layer, and the second compound semiconductor layer includes a GaN-based compound semiconductor material.

REFERENCE SIGNS LIST

11 GaN substrate
20 Light emitting structure
21 First compound semiconductor layer
21a First surface of first compound semiconductor layer
21b Second surface of first compound semiconductor layer
22 Second compound semiconductor layer
22a First surface of second compound semiconductor layer
22b Second surface of second compound semiconductor layer
23 Active layer (light emitting layer)
24 Current confinement layer
25 Opening formed in current confinement layer
31 First electrode
32 Second electrode
33 Pad electrode
41 First light reflecting layer
41A Inclined portion formed in first compound semiconductor layer
42 Second light reflecting layer
43 Bonding layer
44 Supporting substrate
51 Light absorbing material layer

The invention claimed is:

1. A light emitting element, comprising;
a laminated structure comprising:
    a first light reflecting layer;
    a light emitting structure; and
    a second light reflecting layer, wherein
        the light emitting structure includes:
            from the first light reflecting layer side,
            a first compound semiconductor layer;
            an active layer; and
            a second compound semiconductor layer, and
        in the laminated structure, at least two light absorbing material layers are in parallel to a virtual plane occupied by the active layer, wherein the at least two light absorbing material layers have an absorption coefficient twice or more of an optical absorption coefficient of a compound semiconductor that constitutes the light emitting structure.

2. The light emitting element according to claim 1, wherein at least four light absorbing material layers are in parallel to the virtual plane occupied by the active layer.

3. The light emitting element according to claim 1, wherein
when an oscillation wavelength is represented by $\lambda_o$, an equivalent refractive index of a whole of the at least two light absorbing material layers and a portion of the laminated structure located between the at least two light absorbing material layers is represented by $n_{eq}$, and a distance between the at least two light absorbing material layers is represented by $L_0$,
$0.9 \times \{(m \cdot \lambda_0)/(2 \cdot n_{eq})\} \leq L_0 \leq 1.1 \times \{(m \cdot \lambda_0)/(2 \cdot n_{eq})\}$ is satisfied, and m is 1 or any integer of 2 or more including 1.

4. The light emitting element according to claim 1, wherein each of the two at least light absorbing material layers have the thickness of $\lambda 0/(4 \cdot neq)$ or less.

5. The light emitting element according to claim 1, wherein the at least two light absorbing material layers are located at a minimum amplitude portion generated in a standing wave of light formed in the laminated structure.

6. The light emitting element according to claim 1, wherein the active layer is located at a maximum amplitude portion generated in a standing wave of light formed in the laminated structure.

7. The light emitting element according to claim 1, wherein each of the at least two light absorbing material layers includes at least one selected from the group consisting of a compound semiconductor material having a narrower band gap than a compound semiconductor constituting the light emitting structure, a compound semiconductor material doped with impurities, a transparent conductive material, and a light reflecting layer constituting material having a light absorbing characteristic.

8. The light emitting element according to claim 1, wherein each of the first compound semiconductor layer, the active layer, and the second compound semiconductor layer includes a GaN-based compound semiconductor material.

9. The light emitting element according to claim 1, further comprising a supporting substrate on the second light reflecting layer, wherein a bonding layer is between the second light reflecting layer and the supporting substrate.

10. The light emitting element according to claim 1, further comprising:
   a first electrode on the first compound semiconductor layer; and
   a second electrode on the second compound semiconductor layer, wherein a pad electrode is on an edge portion of the second electrode.

11. The light emitting element according to claim 1, further comprising a recess portion on the first compound semiconductor layer, wherein the first light reflecting layer is on the recess portion of the first compound semiconductor layer.

* * * * *